United States Patent [19]

Lewis et al.

[11] 4,278,753

[45] Jul. 14, 1981

[54] PLASMA DEVELOPABLE PHOTORESIST COMPOSITION WITH POLYVINYL FORMAL BINDER

[75] Inventors: James M. Lewis, Aurora; Eugene F. McInerney, Chagrin Falls, both of Ohio

[73] Assignee: Horizons Research Incorporated, Cleveland, Ohio

[21] Appl. No.: 124,413

[22] Filed: Feb. 25, 1980

[51] Int. Cl.³ .................... G03C 1/68; G03C 5/00
[52] U.S. Cl. .................... 430/283; 156/643; 430/281; 430/325; 430/328; 430/434; 430/905; 430/909; 430/913; 430/925
[58] Field of Search ............... 430/281, 325, 328, 905, 430/909, 913, 925, 283, 434; 156/643

[56] References Cited

U.S. PATENT DOCUMENTS

| | | | |
|---|---|---|---|
| 2,902,365 | 9/1959 | Martin | 430/909 X |
| 3,899,338 | 8/1975 | Lewis | 430/282 |
| 3,925,077 | 12/1975 | Lewis et al. | 430/325 |
| 4,050,941 | 9/1977 | Pazos | 430/905 X |

FOREIGN PATENT DOCUMENTS 2055157 11/1970 Fed. Rep. of Germany .
2726813 12/1977 Fed. Rep. of Germany .

Primary Examiner—Edward C. Kimlin
Attorney, Agent, or Firm—Lawrence I. Field

[57] ABSTRACT

A photosensitive composition useful as a photoresist which may be completely processed by dry techniques, especially by means of an oxygen plasma.

The composition includes an N-vinylmonomer and an organic hydrogen compound in a binder which contributes significantly to the utility of the composition in the fabrication of micro-electronic devices.

20 Claims, No Drawings

PLASMA DEVELOPABLE PHOTORESIST COMPOSITION WITH POLYVINYL FORMAL BINDER

This invention relates to a photoresist composition useful in the production of precision microelectronic devices, by totally dry processing techniques.

More particularly it relates to compositions comprising at least one N-vinyl monomer and at least one organic halogen compound which causes said N-vinyl monomer to polymerize when the composition is exposed to a suitable dose of radiation. In addition to the N-vinyl compound and the organic halogen compound, the composition includes a polymeric binder which significantly contributes to the usefulness of said composition in the fabrication of microelectronic devices by purely dry processing techniques especially by means of an oxygen plasma.

One object of the invention is to provide photosensitive compositions which can be processed by entirely dry means and which exhibit enhanced coated part life as compared with prior art compositions.

Another object of the invention is to provide a plasma developable resist with improved resolution and device yield.

Further objects of the invention will be pointed out or will be apparent from the description of preferred embodiments of the invention which follows.

BACKGROUND OF THE INVENTION

The art of photoresists is a highly developed technology and many compositions have been described in the literature for use as photoresists. In general these may be divided into two groups according to the manner in which the composition is to be developed after exposure in order to obtain the desired product. The compositions of one group are developed by wet means, usually by application of a solvent which preferentially dissolves either the exposed or the unexposed areas of the resist and which does not appreciably affect the imaged or non-imaged areas, depending on whether the system is positive working or negative working. The other group comprises compositions which are developed entirely by dry means, e.g. by heat or by other forms of energy such as electron beams, lasers or plasmas. The present invention is directed to an improvement of compositions of the second group.

Lewis et al, U.S. Pat. No. 3,925,077 issued Dec. 9, 1975, describes a photoresist composition comprising at least one N-vinyl monomer, an organic iodine compound which serves as a photoinitiator for the polymerization of the N-vinyl monomer and a bleachout dye dissolved or dispersed in a resin matrix. The composition upon exposure to a pattern of suitable radiation followed by the application of heat, produces a relief image. Such compositions are useful in the production of relief phase holograms and can be useful in photochemical milling applications by the use of appropriate physical development techniques. Performance characteristics of this image recording system are described by Zech et al, Appl. Optics, 12, 2822 (1973) who note that the nature of the relief imagery is such that the nonexposed areas are measurably thinner than the exposed areas.

Other photoresist formulations are described in Lewis, U.S. Pat. No. 3,899,338 issued Aug. 12, 1975. This composition comprises at least one polymerizable N-vinyl monomer and at least one organohalogen photoinitiator dispersed in a resin binder. These compositions form a relief image after exposure and application of heat. One of the compositions of matter described in U.S. Pat. No. 3,899,338 was marketed by Horizons Research Incorporated under the trade name "SOLVARIST" U-200. This material was recently described in German Pat. No. 2,726,813 (Dec. 29, 1977) as being capable of undergoing physical development by means of a totally dry process employing a low temperature RF oxygen plasma which is thought to selectively oxidize and volatilize the unexposed regions of the photoresist coating. A similar process utilizing SOLVARIST U-200 has also been reported by C. T. Penn [IEEE Trans. Electron Devices, ED-26, 640 (1979)]. When freshly prepared, the compositions of U.S. Pat. No. 3,899,338 perform extremely well. However, these compositions exhibit an extremely short coated part life prior to exposure which results in a need for increasing exposure time in order to achieve reproducible relief characteristics after heat fixing. One cause of this problem appears to be due to the use of a highly volatile photoinitiator (iodoform) which rapidly diffuses out of the coating matrix at room temperature. The obvious selection of less volatile photoinitiators does indeed result in an extension of coated part stability but at the expense of photoresponse, solution stability and/or relief characteristics after heat fixing.

THE INVENTION

The present invention is directed to a modification of the photoresist compositions described in U.S. Pat. Nos. 3,899,338 issued Aug. 12, 1975 and 3,925,077 issued Dec. 9, 1975 and others issued to Dr. Eugene Wainer and his co-workers at Horizons Research Incorporated.

Briefly it has been found that when the combination of an N-vinyl monomer and photoinitiator for polymerization of said monomer is placed in a specific resin binder, the resolution and device yield of the resist, when developed by an oxygen plasma is greatly enhanced as compared with the performance of the compositions in U.S. Pat. No. 3,899,338 and similar compositions.

In a system which is to be developed by an oxygen plasma, the binder must possess certain characteristics. First of all it must have a greater susceptibility to oxidation than the photopolymer whether it be a true homopolymer or a graft copolymer arising from interaction between polymerized monomer and the resin matrix. It must also allow for monomer diffusion during the polymerization reaction as well as release of initiator and unreacted monomer during the thermal volatization step. Selection of an appropriate binder is also dependent upon its compatibility with all other components in the formulation so as to produce uniform tack-free coatings. In addition, the thermal flow characteristics (Tg) of the binder must be compatible with subsequent thermal processes so as to maintain high resolution through the entire photolithographic process.

The resin binder which satisfies these requirements and which is utilized in the compositions of the present invention is polyvinylformal, sold commercially by Monsanto Company under the trade name "Formvar". It has been found that by using this material as the binder, there is an increase in coated part life by several orders of magnitude even when used in combination with volatile photoinitiators. In addition, polyvinylformal appears to have a unique affinity for N-vinyl monomers, allowing for their use in much higher concentrations than was possible with other resin binders without inducing coating tackiness. As a consequence higher concentrations of photopolymer may be generated during the imaging process, and this may result in a greater difference in removal rates between exposed and unexposed areas during the development process.

The photoresist compositions of this invention are usually utilized on a support such as metal, eg., copper or aluminum, and glass.

THE PHOTOPOLYMERIZABLE MONOMER

Any of the ethylenically unsaturated monomers set forth in Table I of U.S. Pat. No. 3,899,338 may be utilized in the present invention but the preferred monomers are the N-vinyl amines set out in Section A of the Table. These may be used in combination with any of the N-vinyl amides or imides or other vinyl monomers listed in Table I of U.S. Pat. No. 3,899,338.

The photoinitiators which are useful in the present invention are those described in the patents noted in Section II (column 7 of U.S. Pat. No. 3,899,338) and include organic halogen compounds in which one or more halogen atoms are attached to a single carbon atom, sulfonyl and sulfenyl halides described in U.S. Pat. No. 3,113,024 and mercapto compounds described in U.S. Pat. No. 3,285,744.

The third essential constituent in the compositions of the present invention is the resin binder described above.

In addition, the compositions of the present invention may contain any of the constituents described in U.S. Pat. No. 3,899,338 added for specific benefits, e.g. a phenolic stabilizer, or a sensitizer, color former, or antifogging agent in the proportions set forth in U.S. Pat. No. 3,899,338.

The invention will be further understood from the Examples which follow in which preferred embodiments of the invention are set forth by way of example and is not intended to be limited thereto.

EXAMPLE I

A photoresist formulation was prepared as described in U.S. Pat. No. 3,899,338 by dissolving the ingredients noted below in 100 g of a 1:1 (weight:weight) mixture of N-propyl and N-butyl alcohols:

3.34 grams of N-vinyl carbazole;

0.33 grams of 2,6-di-tertbutyl-p-cresol;

2.81 grams of iodoform; and 6.12 grams of polyvinylbutyral (Monsanto Butvar B-72A)

The mixture was agitated until solution homogeneity was obtained. An aliquot of the resulting photoresist was then applied to an oxidized silicon wafer and spun coated at 3,000 rpm for 30 seconds. The coated wafer was then dried for two minutes at 35° C. in a forced air oven, yielding a coating thickness of 10,000 Å (measured using a Tencor alpha-step thickness analyzer). The coating was then subjected to imagewise exposure for 20 seconds using a high resolution Air Force test pattern in combination with a medium pressure mercury light source, exhibiting an intensity at the exposure plane of 0.25 milliwatts/cm². After exposure, the coating was heated at 100° C. for 1–3 minutes in a forced air oven in order to desensitize the coating to further exposure and induce the formation of a relief image. The unexposed portions of the coating were found to be 8500 Å in thickness, whereas the exposed regions were found to exhibit a thickness of 14,500 Å, thus providing a step of 6000 Å. The coating was then placed in a parallel plate plasma reactor similar in design to that described in Reinberg (U.S. Pat. No. 3,757,733) and was subjected to the effects of an oxygen plasma generated under the following set of conditions:

| | |
|---|---|
| Pressure | 0.75 mm Hg |
| Gas Mixture | Argon/oxygen (50/50 v/v) |
| Power | 70 watts |
| Plate Temperature | 50° C. |

Plasma development times of the order of six minutes provided complete resolution of the original test pattern, and the thickness of the remaining resist was found to be 12,000 Å. The experiment was repeated several times in order to observe the effect of varying the time between coating and exposure on residual film thickness after plasma development. The results are presented in Table I.

TABLE I

Photoresist characteristics as a function of holding time (5) between coating and exposure.

| Time (Minutes) | (A) Thickness After Heat Fixing | | (A) Thickness After Plasma Development (Exposed) |
|---|---|---|---|
| | Unexposed | Exposed | |
| 0 | 8500 | 14,500 | 12,000 |
| 10 | 8500 | 14,500 | 12,000 |
| 20 | 8500 | 13,500 | 11,000 |
| 30 | 8500 | 11,500 | 5,000 |

EXAMPLES II–IV

The procedure of Example I was repeated with three compositions which differed from those in Example I as shown in the following Table:

TABLE II

Composition of Examples II–IV

| Component | | | |
|---|---|---|---|
| N-vinyl carbazole | 200 mg | 500 mg | 500 mg |
| 2,6-di-t-butylcresol | 10 mg | 10 mg | 10 mg |
| Iodoform | | 400 mg | |
| Tetraiodoethylene | 150 mg | | 270 mg |
| Butvar B-72 | 610 mg | | |
| Formvar 12/85 | | 900 mg | 900 mg |
| Solvent | N-propyl alcohol N-butyl alcohol Cellosolve | Diacetone alcohol Xylene 1:1 | Diacetone alcohol Xylene 1:1 |
| Exposure Speed (mj/cm²) | 50 mj | 10 mj | 50 mj |
| Heat Fixing Conditions | 5 min. @ 80° C. 3 min. @100° C. | | |

Table III shows the results obtained when the composition was processed as in Example I.

TABLE III

Processing Characteristics of Examples II–IV

| Example No. | Time In Hours | (A) Thickness After Heat Fixing | | (A) Thickness After Plasma Development (Exposed) |
|---|---|---|---|---|
| | | Unexposed | Exposed | |
| II | 0 | 5500 | 11,000 | 10,500 |
| | 24 | 5500 | 11,000 | 9,500 |
| | 36 | 5500 | 10,500 | 9,000 |
| | 96 | 5500 | 6,500 | 3,500 |
| III | 0 | 6000 | 13,500 | 10,500 |

TABLE III-continued

| | | Processing Characteristics of Examples II-IV | | |
|---|---|---|---|---|
| Example No. | Time In Hours | (A) Thickness After Heat Fixing | | (A) Thickness After Plasma Development (Exposed) |
| | | Unexposed | Exposed | |
| | ½ | 6000 | 13,500 | 9,500 |
| | 1 | 6000 | 8,000 | 3,000 |
| IV | 0 | 8500 | 14,500 | 12,000 |
| | 96 | 8500 | 14,000 | 11,500 |
| | 240 | 8500 | 13,500 | 11,000 |
| | 408 | 8500 | 11,500 | 7,500 |

EXAMPLES V-VIII

Replacement of tetraiodoethylene in Example IV with other non-volatile organo halogen compounds gave similar results after plasma development. The only significant different was observed in using these compounds was a slight change in photosensitivity.

TABLE IV

| Ex. No. | Organo Halogen Compound | W/W Ratio of N-vinyl Carbazole/ organohalogen Compound | Exposure "Speed" mj/cm² |
|---|---|---|---|
| V | Hexabromoethane | 5:1 | 50 |
| VI | Hexabromocyclohexane | 5:1 | 200 |
| VII | Hexabromocyclododecane | 2:1 | 200 |
| VIII | ααdibromoacetophenone | 5:1 | 200 |

From the above it will be seen that the preferred constituents are N-vinyl carbazole and tetraiodoethylene.

Preferred proportions of these constituents in parts by weight are as follows:

| N-vinyl amine (NVC) | 5 to 50 |
|---|---|
| Organic iodine compound (TIE) | 3 to 30 |
| Resin Binder (Polyvinylformal) | 100 |

Of course as indicated previously other specific constituents may be included in the composition to provide stability, antifogging or enhanced sensitivity or other desired properties, and the use of such additives is not intended to be excluded from the present invention which is to be limited only as defined by the appended claims.

We claim:

1. In a photosensitive composition which can be developed as a photoresist by an oxygen plasma, which photosensitive composition consists essentially of a binder containing:
   (1) at least one polymerizable N-vinyl monomer selected from the group consisting of N-vinylamines, N-vinylamides, N-vinylimides; and
   (2) at least one organo-halogen compound which sufficiently enhances the effect of exposing said monomer to a suitable dose of electromagnetic radiation, so as to induce polymerization of said monomer;
   the improvement which consists in providing a polyvinylformal binder having a molecular weight range (weight average) between 10,000 to 40,000 as said binder.

2. The photoresist of claim 1 in which said N-vinyl monmer is N-vinylcarbazole, and said organo-halogen compounds is selected from the group consisting of organo-halogen compounds in which at least one halogen atom selected from the group consisting of chlorine, bromine and iodine is attached to a single carbon atom; sulfonyl chlorides; sulfonyl bromides; sulfenyl chlorides; sulfenyl bromides and mercapto compounds wherein the mercapto group is attached to a carbon atom in a heterocyclic nucleus.

3. The composition of claim 2 wherein the organo-halogen compound is iodoform.

4. A composition of claim 2 wherein the organo-halogen compound is tetraiodoethylene.

5. A composition of claim 2 in which the organo-halogen compound is hexabromoethane.

6. A composition of claim 2 wherein the organo-halogen compound is hexabromocyclohexane.

7. A composition of claim 2 in which the organo-halogen compound is hexabromocyclododecane.

8. A composition of claim 2 wherein the organo-halogen compound is a α, α, α-tribromoacetophenone.

9. The composition of claim 1, including in addition at least one substituted phenol represented by the general formula

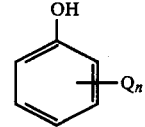

in which Q represents one or more hydroxyl groups, amino groups, alkyl of allyl groups and not all of the Q's need be the same; and n is an integer from 1 to 5.

10. The composition of claim 1, including in addition at least one sensitizing dye which extends the spectral response of the composition; said dyes selected from the group consisting of:
   (a) substituted anthoquinones;
   (b) bi-nuclear merocyanines;
   (c) complex merocyanines;
   (d) cyanines; and
   (e) 9-phenyl-fluroene-9-ols.

11. The composition of claim 1, including in addition at least one pigment or dye in an amount sufficient to enhance visible or ultraviolet contrast when the resist is developed.

12. The photoresist of claim 1 wherein the composition comprises the following proportions in parts by weight:

| organic-halogen compound | 0.3–300 |
|---|---|
| N-vinyl compound | 0.5–500 |
| polyvinylformal binder | 100. |

13. The photoresist of claim 12 wherein the organo-halogen compound is tetraiodoethylene and the N-vinyl compound is N-vinylcarbazole.

14. The resist of claim 1 on a support wherein the support is a metal substrate.

15. The resist of claim 14 wherein the metal substrate is copper.

16. The resist of claim 14 wherein the metal is aluminum.

17. The resist of claim 1 on a support wherein the support is glass.

18. The process which comprises preparing a solution of the photosensitive material defined in claim 1, coating the solution onto a solid substrate, drying the coating, imagewise exposing the coating to suitable radiation, heating the coating after imaging, and removing the unexposed portions of the coating using either wet or dry processing techniques.

19. Process of claim 18 in which the developing technique employs the use of a low temperature RF oxygen plasma.

20. Process of claim 18 in which the wet processing technique employs the use of aqueous acetic acid (40–70% v/v).